(12) United States Patent
Wang et al.

(10) Patent No.: US 10,027,312 B2
(45) Date of Patent: Jul. 17, 2018

(54) LOW TEMPERATURE COEFFICIENT CLOCK SIGNAL GENERATOR

(71) Applicant: NXP USA, INC., Austin, TX (US)

(72) Inventors: Yang Wang, Suzhou (CN); Jianzhou Wu, Suzhou (CN); Yizhong Zhang, Suzhou (CN); Hao Zhi, Suzhou (CN); Bin Zhang, Suzhou (CN); Zhengxiang Wang, Suzhou (CN); Yan Huang, Suzhou (CN)

(73) Assignee: NXP USA, INC., Austin, TX (US)

( * ) Notice: Subject to any disclaimer, the term of this patent is extended or adjusted under 35 U.S.C. 154(b) by 134 days.

(21) Appl. No.: 15/366,845

(22) Filed: Dec. 1, 2016

(65) Prior Publication Data

US 2018/0069531 A1   Mar. 8, 2018

(30) Foreign Application Priority Data

Sep. 8, 2016 (CN) .......................... 2016 1 0808100

(51) Int. Cl.
*H03K 3/26* (2006.01)
*H03K 3/011* (2006.01)
*H03B 5/24* (2006.01)
*H03L 7/00* (2006.01)
*H03K 4/50* (2006.01)
*H03K 3/0231* (2006.01)

(52) U.S. Cl.
CPC ............... *H03K 3/011* (2013.01); *H03B 5/24* (2013.01); *H03K 3/0231* (2013.01); *H03K 4/50* (2013.01); *H03L 7/00* (2013.01)

(58) Field of Classification Search
CPC . H03B 5/24; H03K 4/50; H03K 3/011; H03K 3/0231; H03L 7/00

USPC .................. 331/111, 143, 185, 176; 327/291
See application file for complete search history.

(56) References Cited

U.S. PATENT DOCUMENTS

| | | | |
|---|---|---|---|
| 6,020,792 | A | 2/2000 | Nolan et al. |
| 7,102,452 | B1 | 9/2006 | Holmes |
| 7,598,822 | B2 | 10/2009 | Rajagopal et al. |

(Continued)

OTHER PUBLICATIONS

Jae-Youl Lee, Sung-Eun Kim, Seong-Jun Song, Jin-Kyung Kim, Sunyoung Kin, Hoi-Jun Yoo, "A Regulated Charge Pump with Small Ripple Voltage and Fast Start-up", IEEE Journal of Solid-State Circuits, vol. 41, No. 2, Feb. 2006, pp. 425-432.

*Primary Examiner* — Arnold Kinkead
(74) *Attorney, Agent, or Firm* — Charles E. Bergere

(57) ABSTRACT

A relaxation oscillator for generating a low temperature coefficient (LTC) clock signal includes a reference voltage generator and an oscillator. The reference voltage generator generates an LTC current and a bandgap reference voltage. The reference voltage generator includes positive temperature coefficient (PTC) resistors to compensate for the effects of temperature variations. The oscillator receives the LTC current and the bandgap reference voltage, and generates a clock signal. In another embodiment, the reference voltage generator generates a charge current that varies with temperature. The oscillator receives the charge current and generates first and second output signals. Set and reset comparators include PTC resistors that determine the gains of the set and reset comparators. The PTC resistors compensate for variation in the first and second output signals due to the temperature variations by varying the gains of the set and reset comparators.

13 Claims, 3 Drawing Sheets

(56) References Cited

U.S. PATENT DOCUMENTS

| | | |
|---|---|---|
| 7,760,037 B2 | 7/2010 | Guo et al. |
| 7,843,279 B2 * | 11/2010 | Chou ................... H03B 5/24 331/111 |
| 8,067,992 B2 * | 11/2011 | Chen ................ H03K 3/0231 331/111 |
| 8,643,443 B1 | 2/2014 | Wang |
| 8,773,210 B2 | 7/2014 | Sinha |
| 8,803,619 B1 | 8/2014 | Sinha |

* cited by examiner

LOW TEMPERATURE COEFFICIENT CLOCK SIGNAL GENERATOR

BACKGROUND

The present invention relates generally to integrated circuits, and, more particularly, to an oscillator circuit that generates a low temperature coefficient (LTC) clock signal.

Oscillator circuits such as a ring oscillator, a voltage-controlled oscillator (VCO), a relaxation oscillator, and the like, are used to generate periodic and oscillating signals. For example, a relaxation oscillator circuit is used in circuits such as DC/DC converters, counters, shifters, microcontrollers, and modulation circuits to generate a clock signal. Typically, a relaxation oscillator includes a reference current generator that generates a charge current, and an oscillator that generates an output clock signal based on the charge current. The oscillator includes a switch, set and reset capacitors, comparators, and some logic circuitry.

The set and reset capacitors are connected to the reference current generator via the switch to receive the charge current. The switch receives set and reset signals and provides the charge current to the set capacitor when the set signal is activate to charge the set capacitor to a first input voltage. The switch provides the charge current to the reset capacitor when the reset signal is activate to charge the reset capacitor to a second input voltage. One comparator is used to compare a reference voltage and the first input voltage from the set capacitor, and another comparator is used to compare the reference voltage with the second input voltage from the reset capacitor. The comparator outputs are XORed to generate an input clock signal, and the input clock signal is used to generate the set and reset signals, with one of the set and reset signals comprising the output clock signal.

However, various circuit components of the relaxation oscillator circuit such as the charge current, the reference voltage, capacitances of the set and reset capacitors, resistances of resistors, and the like, are sensitive to temperature variations, and the frequency of the output clock signal will vary with the circuit parameters. Thus, the output clock signal frequency varies significantly with variations in temperature, which is undesirable, because the relaxation oscillator circuit may provide an incorrect output clock signal that can cause the electronic circuit to malfunction.

One way to address temperature sensitivity is to include both positive temperature coefficient (PTC) and negative temperature coefficient (NTC) resistors in the relaxation oscillator circuit. The PTC resistors increase resistances to compensate for a decrease in circuit parameters of the corresponding NTC circuit components with an increase in temperature. The NTC resistors decrease resistances to compensate for an increase in the circuit parameters of the corresponding PTC circuit components with a decrease in temperature. The relaxation oscillator circuit fabricated using FD-SOI technology has optimized power consumption. However, it is difficult to fabricate NTC resistors using FD-SOI technology. Thus, relaxation oscillators that use both PTC and NTC resistors are difficult to fabricate using the FD-SOI technology.

It would be advantageous to have a relaxation oscillator that generates an output clock signal, is less sensitive to temperature variations, and has optimized power consumption.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF PREFERRED EMBODIMENTS

Figure 1:
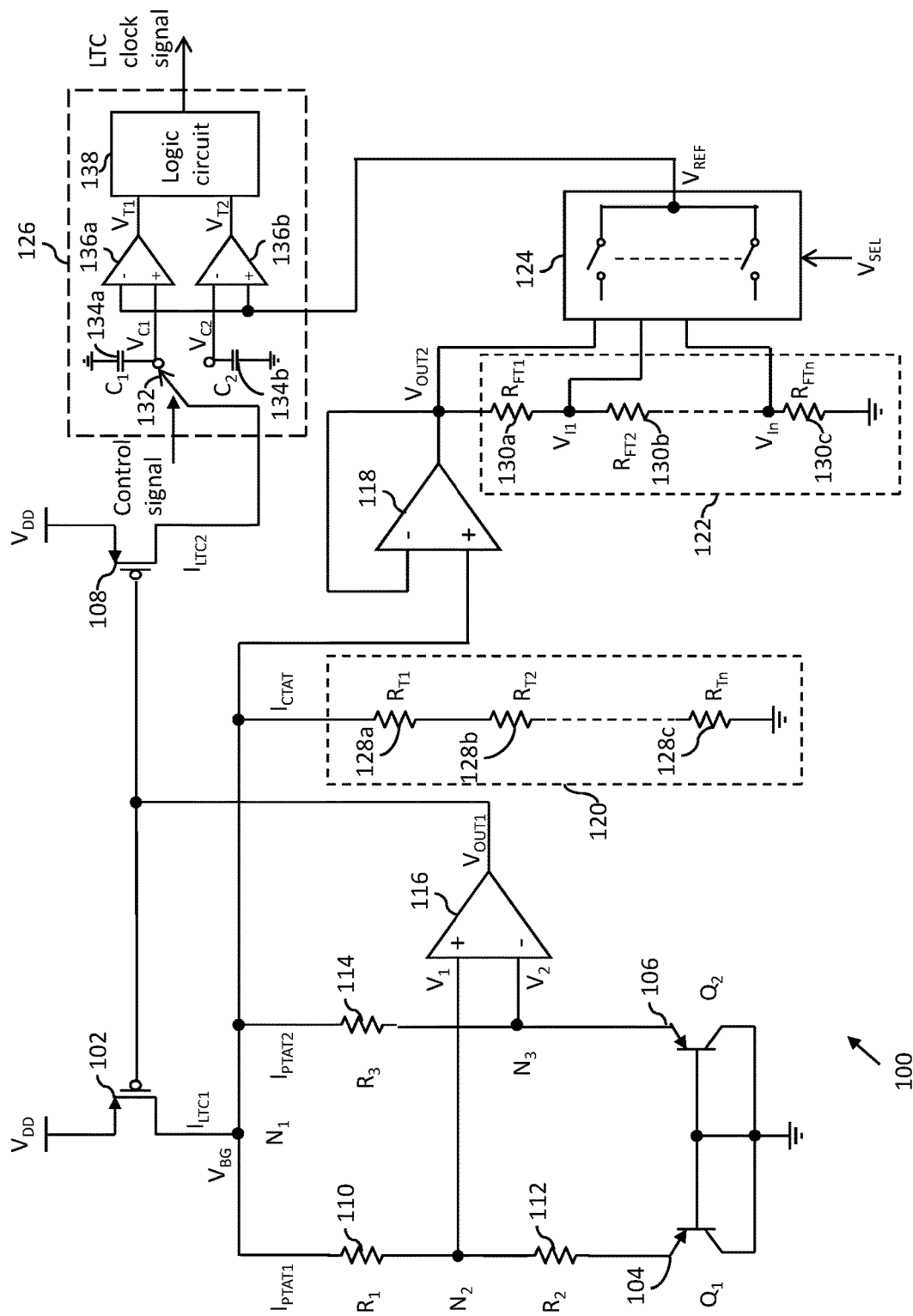
FIG. 1 is a schematic circuit diagram of a relaxation oscillator for generating a low temperature coefficient (LTC) clock signal in accordance with an embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, method steps and structures that comprises a list of elements may include other elements not expressly listed or inherent to such module, circuit, steps or device components. In this specification the terms gate, source and drain may be interchanged, respectively, with the terms base, emitter and collector. Furthermore, the terms coupled and connecting can refer to both direct and indirect connections between elements. As used herein, the term multiplexer has been abbreviated as a mux.

In one embodiment, the present invention provides a relaxation oscillator circuit for generating a low temperature coefficient (LTC) clock signal. The relaxation oscillator circuit includes first through fourth transistors, first and second current paths, first and second amplifiers, a first resistor ladder, and an oscillator. The first transistor has a source connected to a supply voltage and a drain that provides a first LTC current. The first current path includes first and second series connected resistors and the second current path includes a third resistor. The first resistor has a first terminal connected to the drain of the first transistor and a first terminal of the third resistor to form a first node that outputs a bandgap voltage. The first resistor has a second terminal connected to a first terminal of the second resistor to form a second node. The first terminal of the first resistor receives a first proportional-to-absolute-temperature (PTAT) current and generates a first voltage at the second node. The second transistor has an emitter connected to a second terminal of the second resistor, and base and collector terminals connected to ground. The third transistor has base and collector terminals connected to the base terminal of the second transistor. The third transistor has an emitter connected to a second terminal of the third resistor to form a third node. The first terminal of the third resistor receives a second PTAT current and generates a second voltage at the third node. The first amplifier receives the first and second voltages and outputs a first output signal based on a comparison of the first voltage with the second voltage. The first amplifier activates the first output signal when the first voltage is greater than the second voltage, and deactivates the first output signal when the first voltage is less than the second voltage. The first resistor ladder is connected between the first node and ground to receive a complementary-to-absolute-temperature (CTAT) current. The first LTC current is a sum of the first PTAT current, the second PTAT current, and the CTAT current. The first resistor ladder comprises a set of series connected positive temperature coefficient (PTC) resistors. The second amplifier receives and buffers the bandgap voltage and generates a second output signal, which is an LTC voltage. The fourth transistor has a source connected to the supply voltage, a gate connected to a gate of the first transistor, and a drain that mirrors the first LTC current and generates a second LTC current. The oscillator is connected to the second amplifier to receive the second output signal as a reference voltage, and is connected to the drain of the fourth transistor to receive the second LTC current, and generate the LTC clock signal.

In another embodiment, the present invention provides a relaxation oscillator circuit for generating a low temperature coefficient (LTC) clock signal. The relaxation oscillator circuit includes set and reset discharge transistors, a set-reset (SR) latch, and set and reset comparators. The set and reset discharge transistors are connected across set and reset capacitors, respectively. The SR latch has a set output terminal coupled to a gate of the set discharge transistor, and a reset output terminal coupled to a gate of the reset discharge transistor. The set output terminal outputs a set signal, and the reset output terminal outputs a reset signal. The SR latch also has a set input terminal coupled to its reset output terminal, a reset input terminal to receive an external reset signal, and a clock input terminal to receive a clock signal. The set capacitor receives a charge current and is charged to a first input voltage when the set signal is activated. Similarly, the reset capacitor receives the charge current and is charged to a second input voltage when the reset signal is activated. The set comparator has a first input coupled to a first terminal of the set capacitor, a second input that receives a reference voltage, and an output coupled to the clock input terminal by way of an XOR gate to output a first output signal. The set comparator includes first and second input transistors, first and second series connected resistors, first and second bias transistors, a first control transistor, and a first output transistor. The first and second input transistors form a pair of parallel coupled transistors that have a common node that receives a first reference current. The first input transistor has a gate that provides the first input voltage to the first input of the set comparator. The second input transistor has a gate that provides the reference voltage to the second input of the set comparator. The first and second series connected resistors are connected between the drains of the first and second input transistors. The first and second resistors are positive temperature coefficient (PTC) resistors. The first and second bias transistors each have a gate connected to a node between the first and second series connected resistors, and a source connected to ground. The drains of the first and second bias transistors are connected to the drains of the first and second input transistors, respectively. The connection of the drains of the second input transistor and the second bias transistor forms a first intermediate node at which a first intermediate output signal is provided. The first control transistor has a gate connected to the set output terminal and a source connected to a supply voltage. The first output transistor has a gate connected to the first intermediate node to receive the first intermediate output signal, a source connected to ground, and a drain connected to a drain of the first control transistor.

The connection of the drains of the first control transistor and the first output transistor forms a first output node at which a first node voltage is provided. An inverted version of the first node voltage is output as the first output signal. The reset comparator has a first input coupled to a first terminal of the reset capacitor, a second input that receives the reference voltage, and an output coupled to the clock input terminal by way of the XOR gate to output a second output signal. The relaxation oscillator circuit provides at least one of the set and reset signals as the LTC clock signal.

Various embodiments of the present invention provide a relaxation oscillator circuit for generating a low temperature coefficient (LTC) clock signal. The relaxation oscillator circuit includes a current generator and an oscillator. The current generator generates a charge current. The oscillator is connected to the current generator to receive the charge current and generate the LTC clock signal. The LTC clock signal has little variation with variations in temperature. In one embodiment, the current generator is a bandgap reference generator. The current generator includes first through fourth transistors, first and second current paths, and a first resistor ladder. A first LTC current is generated at the drain of the first transistor. The first current path includes first and second PTC resistors, and the second current path includes a third PTC resistor. The first current path receives a first PTAT current and the second current path receives a second PTAT current. The first resistor ladder receives a CTAT current. The first and second PTAT currents are directly proportional to the temperature and the CTAT current is inversely proportional to temperature. Thus, the variation in the first and second PTAT currents is compensated for by variations in the CTAT current. The first LTC current is the sum of the first and second PTAT currents and the CTAT current and remains constant, regardless of the variation in the temperature. The fourth transistor has a drain that mirrors the first LTC current and generates a second LTC current. The second LTC current is the charge current of the current generator. The oscillator receives the second LTC current and generates the LTC clock signal. When the temperature varies, the first and second PTAT currents and the CTAT current change to compensate for the effect of variations in temperature, and generate the second LTC current.

In another embodiment, the current generator provides a charge current that is at least one of a positive temperature coefficient (PTC) charge current and a negative temperature coefficient (NTC) charge current. The charge current varies significantly with variations in the temperature. The oscillator receives the charge current, compensates for the effect of the variation in the charge current and generates the LTC clock signal, which has little variation with variations in the temperature. The oscillator includes a set-reset (SR) latch, set and reset capacitors, set and reset discharge transistors, and set and reset comparators. The SR latch receives a clock signal and generates set and reset signals. The set capacitor receives the charge current and is charged to a first input voltage. The reset capacitor receives the charge current and is charged to a second input voltage. The set comparator compares the first input voltage with a reference voltage and generates a first output signal. The set comparator includes first and second PTC resistors that alter a gain of the set comparator. Thus, the gain of the set comparator is directly proportional to the temperature. Further, a delay in the first output signal is inversely proportional to the gain of the set comparator. Thus, the first and second PTC resistors of the set comparator provide a delay in the first output signal that is inversely proportional to the temperature. Similarly, the reset comparator compares the second input voltage with the reference voltage and generates a second output signal. The reset comparator includes third and fourth PTC resistors that alter a gain of the reset comparator. Thus, the gain of the reset comparator is directly proportional to the temperature. Further, a delay in the second output signal is inversely proportional to the gain of the reset comparator. Thus, the third and fourth PTC resistors of the reset comparator provide a delay in the second output signal that is inversely proportional to the temperature.

The PTC resistors of the set and reset comparators compensate for the effect of variations in temperature by adjusting the delay of the first and second output signals. The SR latch receives the XOR of the first and second output signals as the clock signal and activates at least one of the set and reset signals. The relaxation oscillator circuit provides at least one of the set and reset signals as the LTC clock signal.

The relaxation oscillator circuit does not include NTC resistors, so fabrication processes such as Fully Depleted Silicon On Insulator (FD-SOI), which are not suitable for the fabrication of NTC resistors, may be used to fabricate the relaxation oscillator circuit.

Referring now to FIG. 1, a schematic circuit diagram of a relaxation oscillator circuit 100 for generating a low temperature coefficient (LTC) clock signal in accordance with an embodiment of the present invention is shown. The relaxation oscillator circuit 100 includes first through fourth transistors 102-108, first through third resistors 110-114, first and second amplifiers 116 and 118, first and second resistor ladders 120 and 122, a multiplexer or mux 124, and an oscillator 126. The first resistor ladder 120 includes a set of series connected positive temperature coefficient (PTC) resistors, three of which are shown—first through third PTC resistors 128a-128c. The second resistor ladder 122 includes a set of series connected resistors, three of which are shown—first through third trim resistors 130a-130c. The oscillator 126 includes a switch 132, first and second capacitors 134a and 134b, first and second comparators 136a and 136b, and a logic circuit 138.

The first and fourth transistors 102 and 108 have source terminals connected to a supply voltage $V_{DD}$. The first transistor 102 has a gate terminal connected to a gate terminal of the fourth transistor 108 to form a current mirror. A drain terminal of the first transistor 102 outputs a first LTC current $I_{LTC1}$. A drain terminal of the fourth transistor 108 mirrors the first LTC current $I_{LTC1}$ and generates a second LTC current $I_{LTC2}$.

The first and second resistors 110 and 112 are connected in series to form a first current path and the third resistor 114 forms a second current path. In the presently preferred embodiment, a resistance of the first resistor 110 is a multiple "x" of a resistance of the second resistor 112, where "x" is a positive integer. The resistance of the first resistor 110 is equal to a resistance of the third resistor 114. Further, the first through third resistors 110-114 are PTC resistors. Thus, the resistances of the first through third resistors 110-114 are directly proportional to the temperature. The first and third resistors 110 and 114 each have a first terminal connected to the drain terminal of the first transistor 102 to form a first node $N_1$. A bandgap voltage $V_{BG}$, which is an LTC voltage, is output at the first node $N_1$. A first terminal of the second resistor 112 is connected to a second terminal of the first resistor 110 to form a second node $N_2$. Further, a first PTAT current $I_{PTAT1}$ flows through the first current path, and a second PTAT current $I_{PTAT2}$ flows through the second current path. A first voltage $V_1$ is output at the second node $N_2$ when the first PTAT current $I_{PTAT1}$ flows through the first current path.

The second transistor 104 has an emitter terminal connected to a second terminal of the second resistor 112, a collector terminal connected to ground, and a base terminal connected to its collector terminal. The third transistor 106 has an emitter terminal connected to a second terminal of the third resistor 114, a collector terminal connected to ground, and a base terminal connected to its collector terminal. The emitter terminal of the third transistor 106 and the second terminal of the third resistor 114 form a third node $N_3$. A second voltage $V_2$ is output at the third node $N_3$ when the second PTAT current $I_{PTAT2}$ flows through the second current path. In the presently preferred embodiment, the first and fourth transistors 102 and 108 are p-channel metal-oxide semiconductor (PMOS) transistors, and the second and third transistors 104 and 106 are positive-negative-positive bipolar junction transistors (PNP BJTs). An area of the second transistor 104 is a multiple "y" of an area of the third transistor 106, where "y" is a positive integer.

The first amplifier 116 has a first terminal connected to the second node $N_2$ to receive the first voltage $V_1$, a second terminal connected to the third node $N_3$ to receive the second voltage $V_2$, and an output terminal to output a first output signal $V_{OUT1}$ based on a comparison of the first voltage $V_1$ with the second voltage $V_2$. The first amplifier 116 activates the first output signal $V_{OUT1}$ when the first voltage $V_1$ is greater than the second voltage $V_2$, and deactivates the first output signal $V_{OUT1}$ when the first voltage $V_1$ is less than the second voltage $V_2$. The output terminal of the first amplifier 116 is connected to the gate terminals of the first and fourth transistors 102 and 108.

The first resistor ladder 120 receives a CTAT current $I_{CTAT}$. The first and second current paths compensate for the effect of the variation in the first LTC current $I_{LTC1}$ due to an increase in the temperature and the first resistor ladder 120 compensates for the effect of the variation in the first LTC current $I_{LTC1}$ due to a decrease in the temperature. Thus, variations of the first LTC current $I_{LTC1}$ due to variations in temperature are reduced.

The second amplifier 118 has a first terminal connected to its output terminal and a second terminal connected to the first node $N_1$ to receive the bandgap voltage $V_{BG}$. In the presently preferred embodiment, the second amplifier 118 is a unity gain amplifier. The second amplifier 118 buffers the bandgap voltage $V_{BG}$ and generates a second output signal $V_{OUT2}$ at its output terminal. Since the second output signal $V_{OUT2}$ is generated based on the bandgap voltage $V_{BG}$, the second output signal $V_{OUT2}$ is an LTC voltage.

The second resistor ladder 122 is connected to the output terminal of the second amplifier 118 and ground. The second resistor ladder 122 receives the second output signal $V_{OUT2}$ and generates multiple intermediate reference voltages including first through third intermediate reference voltages $V_{I1}$-$V_{In}$.

The mux 124 is connected to the output terminal of the second amplifier 118 and the second resistor ladder 122 to receive the second output signal $V_{OUT2}$ and the multiple intermediate reference voltages $V_{I1}$-$V_{In}$, respectively. The mux 124 further receives a select signal $V_{SEL}$. The mux 124 has an output terminal that outputs one of the second output signal $V_{OUT2}$ and an intermediate reference voltage of the multiple intermediate reference voltages $V_{I1}$-$V_{In}$ as a reference voltage $V_{REF}$, as specified by the select signal $V_{SEL}$.

Since the reference voltage $V_{REF}$ is generated based on the second output signal $V_{OUT2}$, the reference voltage $V_{REF}$ is an LTC voltage.

In presently preferred embodiment, the oscillator 126 is a relaxation oscillator. The oscillator 126 is connected to the drain terminal of the fourth transistor 108 to receive the second LTC current $I_{LTC2}$, and to the mux 124 to receive the reference voltage $V_{REF}$. The oscillator 126 generates the LTC clock signal based on the second LTC current $I_{LTC2}$ and the reference voltage $V_{REF}$.

The first and second capacitors 134a and 134b receive the second LTC current $I_{LTC2}$ by way of the switch 132, which is activated based on a control signal. In one embodiment, the control signal is the LTC clock signal. When the switch 132 is connected to the first capacitor 134a, the switch 132 provides the second LTC current $I_{LTC2}$ to the first capacitor 134a and charges the first capacitor 134a to a first charge voltage $V_{C1}$. Similarly, when the switch 132 is connected to the second capacitor 134b, the switch 132 provides the second LTC current $I_{LTC2}$ to the second capacitor 134b and charges the second capacitor 134b to a second charge voltage $V_{C2}$.

The first comparator 136a has a first terminal connected to the output terminal of the mux 124 to receive the reference voltage $V_{REF}$ and a second terminal connected to the first capacitor 134a to receive the first charge voltage $V_{C1}$. The first comparator 136a has an output terminal that outputs a first trigger signal $V_{T1}$ based on a comparison of the first charge voltage $V_{C1}$ with the reference voltage $V_{REF}$. The first comparator 136a activates the first trigger signal $V_{T1}$ when the first charge voltage $V_{C1}$ is greater than the reference voltage $V_{REF}$ and deactivates the first trigger signal $V_{T1}$ when the first charge voltage $V_{C1}$ is less than the reference voltage $V_{REF}$.

The second comparator 136b has a first terminal connected to the output terminal of the mux 124 to receive the reference voltage $V_{REF}$ and a second terminal connected to the second capacitor 134b to receive the second charge voltage $V_{C2}$. The second comparator 136b has an output terminal that outputs a second trigger signal $V_{T2}$ based on a comparison of the second charge voltage $V_{C2}$ with the reference voltage $V_{REF}$. The second comparator 136b activates the second trigger signal $V_{T2}$ when the second charge voltage $V_{C2}$ is less than the reference voltage $V_{REF}$ and deactivates the second trigger signal $V_{T2}$ when the second charge voltage $V_{C2}$ is greater than the reference voltage $V_{REF}$. Since the first and second trigger signals $V_{T1}$ and $V_{T2}$ are generated based on the second LTC current $I_{LTC2}$ and the reference voltage $V_{REF}$, the first and second trigger signals $V_{T1}$ and $V_{T2}$ are LTC voltages.

The logic circuit 138 is connected to the first and second comparators 136a and 136b to receive the first and second trigger signals $V_{T1}$ and $V_{T2}$ and generates the LTC clock signal. In one embodiment, the logic circuit 138 includes a set-reset (SR) latch (not shown) having a set input terminal, a reset input terminal that receives an external reset signal, a clock input terminal that receives a clock signal, a set output terminal that outputs a set signal, and a reset output terminal coupled to the set input terminal thereof that outputs a reset signal. The logic circuit 138 further includes an XOR gate (not shown) that receives the first and second trigger signals $V_{T1}$ and $V_{T2}$ and generates the clock signal. The logic states of the set and reset signals toggle based on the clock signal, which is generated based on the first and second trigger signals $V_{T1}$ and $V_{T2}$. Thus, the LTC clock signal has minimum variation due to variation in the temperature.

In operation, the first and second current paths receive the first and second PTAT currents $I_{PTAT1}$ and $I_{PTAT2}$, respectively. The first and second PTAT currents $I_{PTAT1}$ and $I_{PTAT2}$ are directly proportional to the temperature. The first PTAT current $I_{PTAT1}$ flows through the first current path and generates the first voltage $V_1$ at the first node $N_1$. Similarly, the second PTAT current $I_{PTAT2}$ flows through the second current path and generates the second voltage $V_2$ at the second node $N_2$. The first amplifier 116 compares the first and second voltages $V_1$ and $V_2$, and generates the first output signal $V_{OUT1}$.

The first amplifier 116 operates like an error amplifier that modulates the first and second PTAT currents $I_{PTAT1}$ and $I_{PTAT2}$ such that the first and second voltages $V_1$ and $V_2$ remain constant. When the first voltage $V_1$ is greater than the second voltage $V_2$, the first amplifier 116 activates the first output signal $V_{OUT}$. Thus, when the first LTC current $I_{LTC1}$ decreases, the first and second PTAT currents $I_{PTAT1}$ and $I_{PTAT2}$ decrease. When the first and second PTAT currents $I_{PTAT1}$ and $I_{PTAT2}$ decrease, the first voltage $V_1$ decreases due to a decrease in the voltage drop across the first and second resistors 110 and 112, and the second voltage $V_2$ decreases due to a decrease in the voltage drop across the third resistor 114. However, the decrease in the voltage drop across the first and second resistors 110 and 112 is greater than the decrease in the voltage drop across the third resistor 114. When the first voltage $V_1$ is less than the second voltage $V_2$, the first amplifier 116 deactivates the first output signal $V_{OUT1}$. The first amplifier 116 deactivates the first output signal $V_{OUT1}$ until the first voltage $V_1$ is equal to the second voltage $V_2$. Thus, the first amplifier 116 compensates for the increase in the first voltage $V_1$ by varying the first output signal ($V_{OUT1}$).

Similarly, when the first voltage $V_1$ is less than the second voltage $V_2$, the first amplifier 116 deactivates the first output signal $V_{OUT1}$. Thus, the first LTC current $I_{LTC1}$ increases, and the first and second PTAT currents $I_{PTAT1}$ and $I_{PTAT2}$ increase. When the first and second PTAT currents $I_{PTAT1}$ and $I_{PTAT2}$ increase, the first voltage $V_1$ also increases due to an increase in the voltage drop across the first and second resistors 110 and 112, and the second voltage $V_2$ increases due to an increase in the voltage drop across the third resistor 114. However, the increase in the voltage drop across the first and second resistors 110 and 112 is greater than the increase in the voltage drop across the third resistor 114. When the first voltage $V_1$ is greater than the second voltage $V_2$, the first amplifier 116 activates the first output signal $V_{OUT1}$. The first amplifier 116 activates the first output signal $V_{OUT1}$ until the first voltage $V_1$ is equal to the second voltage $V_2$. Thus, the first amplifier 116 compensates for the decrease in the first voltage $V_1$ by varying the first output signal ($V_{OUT1}$). The first resistor ladder 120 receives the CTAT current $I_{CTAT}$, which is inversely proportional to the temperature.

When the temperature increases, the first and second PTAT currents $I_{PTAT1}$ and $I_{PTAT2}$ increase, and the CTAT current $I_{CTAT}$ decreases. Since the first and second PTAT currents $I_{PTAT1}$ and $I_{PTAT2}$ increase, the first and second voltages $V_1$ and $V_2$ increase with the increase in temperature. However, the increase in the first voltage $V_1$ is greater than the increase in the second voltage $V_2$. When the first voltage $V_1$ is greater than the second voltage $V_2$, the first amplifier 116 activates the first output signal $V_{OUT1}$. The first and second PTAT currents $I_{PTAT1}$ and $I_{PTAT2}$ are varied such that the first voltage $V_1$ is equal to the second voltage $V_2$, thereby compensating for the effect of increase in the temperature.

When the temperature decreases, the first and second PTAT currents $I_{PTAT1}$ and $I_{PTAT2}$ decrease, and the CTAT current $I_{CTAT}$ increases. Since the first and second PTAT currents $I_{PTAT1}$ and $I_{PTAT2}$ decrease, the first and second voltages $V_2$ and $V_2$ decrease with the decrease in the temperature. However, the decrease in the first voltage $V_1$ is greater than the decrease in the second voltage $V_2$. When the first voltage $V_1$ is less than the second voltage $V_2$, the first amplifier 116 deactivates the first output signal $V_{OUT1}$. The first and second PTAT currents $I_{PTAT1}$ and $I_{PTAT2}$ are varied such that the first voltage $V_1$ is equal to the second voltage $V_2$, thereby compensating for the effect of decrease in the temperature. Thus, the first LTC current $I_{LTC1}$ remains constant irrespective of the variations in the temperature.

The fourth transistor 108 mirrors the first LTC current $I_{LTC1}$ and generates the second LTC current $I_{LTC2}$. Since, the first LTC current $I_{LTC1}$ has less variation with the variations in the temperature, the second LTC current $I_{LTC2}$ also has less variation with the variations in the temperature. Further, the second amplifier 118 buffers the bandgap voltage $V_{BG}$ and generates the second output signal $V_{OUT2}$. Thus, the second resistor ladder 122 generates the intermediate reference voltages $V_{I1}$-$V_{In}$ based on the bandgap voltage $V_{BG}$. The mux 124 provides at least one of an intermediate reference voltage of the multiple intermediate reference voltages $V_{I1}$-$V_{In}$ and the second output signal $V_{OUT2}$ as the reference voltage $V_{REF}$ based on the select signal $V_{SEL}$. The oscillator 126 receives the second LTC current $I_{LTC2}$ and the reference voltage $V_{REF}$, and generates the LTC clock signal.

Since the second LTC current $I_{LTC2}$ and the reference voltage $V_{REF}$ have minimal variations with respect to variations in temperature, the LTC clock signal generated by the oscillator 126 has minimal variations with respect to variations in temperature. The relaxation oscillator circuit 100 includes only PTC resistors. Thus, such a relaxation oscillator circuit 100 can be manufactured by using FD-SOI technology, which is not suitable for the fabrication of NTC resistors.

Figure 2:
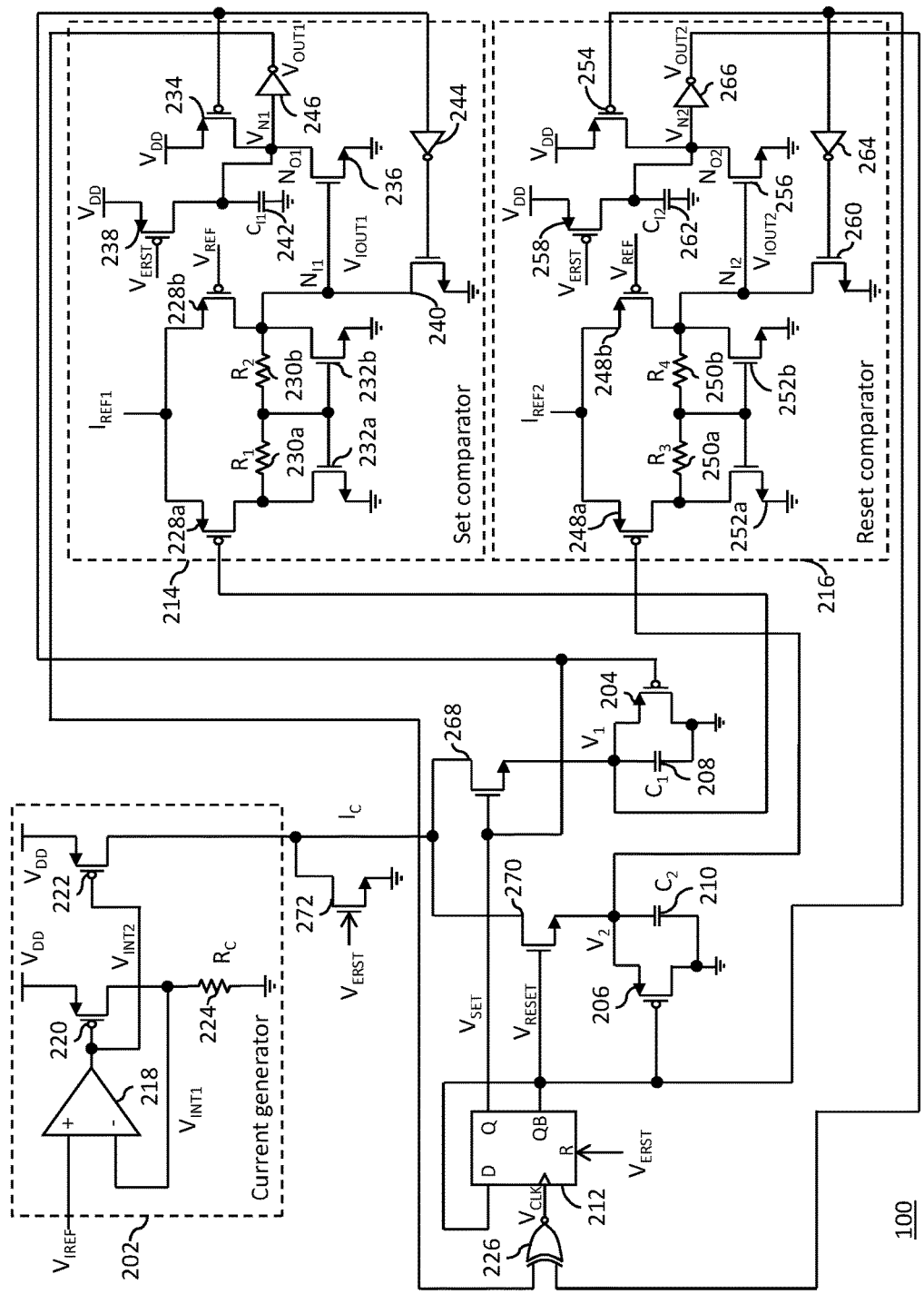
FIG. 2 is a schematic circuit diagram of a relaxation oscillator for generating the LTC clock signal in accordance with another embodiment of the present invention.

Referring now to FIG. 2, a schematic circuit diagram of the relaxation oscillator circuit 100 for generating the LTC clock signal in accordance with another embodiment of the present invention is shown. The relaxation oscillator circuit 100 includes a current generator 202, set and reset discharge transistors 204 and 206, set and reset capacitors 208 and 210, a SR latch 212, and set and reset comparators 214 and 216. The current generator 202 includes an amplifier 218, first and second current generator transistors 220 and 222, and an intermediate resistor 224. The relaxation oscillator circuit 100 further includes an XOR gate 226. The set comparator 214 includes first and second input transistors 228a and 228b, first and second resistors 230a and 230b, first and second bias transistors 232a and 232b, a first control transistor 234, and a first output transistor 236. The set comparator 214 also includes first and second intermediate transistors 238 and 240, a first intermediate capacitor 242, a first inverter 244, and a first output inverter 246. The reset comparator 216 includes third and fourth input transistors 248a and 248b, third and fourth resistors 250a and 250b, third and fourth bias transistors 252a and 252b, a second control transistor 254, and a second output transistor 256. The reset comparator 216 includes third and fourth intermediate transistors 258 and 260, a second intermediate capacitor 262, a second inverter 264, and a second output inverter 266. The relaxation oscillator circuit 100 also includes first and second bypass transistor 268 and 270, and a reset transistor 272.

The current generator 202 receives an intermediate reference voltage $V_{IREF}$ and generates a charge current $I_C$, which is at least one of a PTC current and an NTC current. In the presently preferred embodiment, the current generator 202 is a voltage-to-current converter that receives the reference voltage $V_{REF}$ and generates the charge current $I_C$.

The amplifier 218 has a positive input terminal that receives the reference voltage $V_{REF}$, a negative input terminal connected to a drain terminal of the first current generator transistor 220 to receive a first intermediate voltage $V_{INT1}$, and an output terminal connected to gate terminals of the first and second current generator transistors 220 and 222 to output a second intermediate voltage $V_{INT2}$. The first current generator transistor 220 has a source terminal connected to a supply voltage $V_{DD}$ and the drain terminal that outputs the first intermediate voltage $V_{INT1}$. The intermediate resistor 224 is connected between the drain terminal of the first current generator transistor 220 and ground. The second current generator transistor 222 has a source terminal connected to the supply voltage $V_{DD}$ and a drain terminal that outputs the charge current $I_C$. It will be understood by those with skill in the art that the current generator 202 is not restricted to the use of a voltage-to-current converter. Various types of current generators are known in the art that may be used to generate the charge current $I_C$.

The reset transistor 272 has a gate terminal to receive an external reset signal $V_{ERST}$, a drain terminal connected to the current generator 202 to receive the charge current $I_C$, and a source terminal connected to ground. The reset transistor 272 bypasses the charge current $I_C$ when the external reset signal $V_{ERST}$ is activated.

The first bypass transistor 268 has a gate terminal that receives a set signal $V_{SET}$ and a drain terminal connected to the current generator 202 to receive the charge current $I_C$. The first bypass transistor 268 provides the charge current $I_C$ to the set capacitor 208 when the set signal $V_{SET}$ is activated.

The second bypass transistor 270 has a gate terminal that receives a reset signal $V_{RESET}$ and a drain terminal connected to the current generator 202 to receive the charge current $I_C$. The second bypass transistor 270 provides the charge current $I_C$ to the reset capacitor 210 when the reset signal $V_{RESET}$ is activated.

The set discharge transistor 204 has a source terminal connected to a source terminal of the first bypass transistor 268 and a drain terminal connected to ground. The reset discharge transistor 206 has a source terminal connected to a source terminal of the second bypass transistor 270 and a drain terminal connected to ground. A first terminal of the set capacitor 208 is connected to the source terminal of the set discharge transistor 204 and a second terminal of the set capacitor 208 is connected to ground. A first terminal of the reset capacitor 210 is connected to the source terminal of the reset discharge transistor 206 and a second terminal of the reset capacitor 210 is connected to ground.

The SR latch 212 has a reset input terminal to receive the external reset signal $V_{ERST}$ and a clock input terminal to receive a clock signal $V_{CLK}$. In the presently preferred embodiment, the SR latch 212 is configured as a D flip-flop. The SR latch 212 also has a set output terminal coupled to a gate terminal of the set discharge transistor 204 to output the set signal $V_{SET}$, and a reset output terminal coupled to a set input terminal thereof and a gate terminal of the reset discharge transistor 206 to output the reset signal $V_{RESET}$. When the SR latch 212 activates the set signal $V_{SET}$, the set capacitor 208 receives the charge current $I_C$ from the current generator 202 and is charged to a first input voltage $V_1$. Similarly, when the SR latch 212 activates the reset signal $V_{RESET}$, the reset capacitor 210 receives the charge current $I_C$ from the current generator 202 and is charged to a second input voltage $V_2$.

The set comparator 214 has a first input coupled to the first terminal of the set capacitor 208 to receive the first input voltage $V_1$, a second input receives a reference voltage $V_{REF}$, and an output coupled to the clock input terminal of the SR latch 212 by way of the XOR gate 226 to output a first output signal $V_{OUT1}$. The reference voltage $V_{REF}$ is generated by a reference voltage generator (not shown).

The first input transistor 228a has a source terminal that receives a first reference current $I_{REF1}$, and a gate terminal connected to the first terminal of the set capacitor 208 to receive the first input voltage $V_1$. The gate terminal of the first input transistor 228a provides the first input of the set comparator 214. A first current source (not shown) provides the first reference current $I_{REF1}$.

The second input transistor 228b has a source terminal that receives the first reference current $I_{REF1}$, and a gate terminal that provides the second input of the set comparator 214 and receives the reference voltage $V_{REF}$.

The first and second resistors 230a and 230b are connected in series, and the series combination of the first and second resistors 230a and 230b is connected between the drain terminals of the first and second input transistors 228a and 228b. The resistances of the first and second resistors 230a and 230b determine a gain of the set comparator 214. In the presently preferred embodiment, the first and second resistors 230a and 230b are PTC resistors. Thus, the gain of the set comparator 214 is directly proportional to the temperature.

The first bias transistor 232a has a gate terminal connected to a node between the first and second series connected resistors 230a and 230b, a source terminal connected to ground, and a drain terminal connected to a drain terminal of the first input transistor 228a.

The second bias transistor 232b has a gate terminal connected to the node between the first and second series connected resistors 230a and 230b, a source terminal connected to ground, and a drain terminal connected to a drain terminal of the second input transistor 228b. A first intermediate output signal $V_{IOUT1}$ is output at a first intermediate node $N_{I1}$ formed by interconnection of the drain terminals of the second input transistor 228b and the second bias transistor 232b.

The first control transistor 234 has a gate terminal connected to the set output terminal and a source terminal connected to the supply voltage $V_{DD}$. The first output transistor 236 has a gate terminal connected to the first intermediate node $N_{I1}$ to receive the first intermediate output signal $V_{IOUT1}$, a source terminal connected to ground, and a drain terminal connected to a drain terminal of the first control transistor 234. A first node voltage $V_{N1}$ is output at a first output node $N_{O1}$ formed by an interconnection of the drain terminals of the first control transistor 234 and the first output transistor 236.

The first intermediate transistor 238 has a gate terminal to receive the external reset signal $V_{ERST}$, a drain terminal connected to the first output node $N_{O1}$, and a source terminal connected to the supply voltage $V_{DD}$. The first intermediate capacitor 242 is a parasitic capacitor that is connected between the first output node $N_{O1}$ and ground. The second intermediate transistor 240 has a gate terminal connected to the set output terminal by way of the first inverter 244, a source terminal connected to ground, and a drain terminal connected to the first intermediate node $N_{I1}$. The first output inverter 246 receives the first node voltage $V_{N1}$ and outputs the first output signal $V_{OUT1}$.

The reset comparator 216 has a first input coupled to the first terminal of the reset capacitor 210 to receive the second input voltage $V_2$, and a second input that receives the reference voltage $V_{REF}$. The reset comparator 216 also has an output coupled to the clock input terminal by way of the XOR gate 226 to output a second output signal $V_{OUT2}$.

The third input transistor 248a has a source terminal that receives a second reference current $I_{REF2}$ and a gate terminal that provides the first input of the reset comparator 216. The second reference current $I_{REF2}$ is provided by a current source (not shown). The gate terminal of the third input transistor 248a is connected to the first terminal of the reset capacitor 210 to receive the second input voltage $V_2$.

The fourth input transistor 248b has a source terminal that receives the second reference current $I_{REF2}$ and a gate terminal that provides the second input of the reset comparator 216. The gate terminal of the fourth input transistor 248b receives the reference voltage $V_{REF}$.

The third and fourth resistors 250a and 250b are connected in series, and the series combination of the third and fourth resistors 250a and 250b is connected between the drain terminals of the third and fourth input transistors 248a and 248b. The resistances of the third and fourth resistors 250a and 250b determines a gain of the reset comparator 216. In the presently preferred embodiment, the third and fourth resistors 250a and 250b are PTC resistors. Thus, the gain of the reset comparator 216 is directly proportional to the temperature.

The third bias transistor 252a has a gate terminal connected to a node between the third and fourth series connected resistors 250a and 250b, a source terminal connected to ground, and a drain terminal connected to a drain terminal of the third input transistor 248a.

The fourth bias transistor 252b has a gate terminal connected to the node between the third and fourth series connected resistors 250a and 250b, a source terminal connected to ground, and a drain terminal connected to a drain terminal of the fourth input transistor 248b. A second intermediate output signal $V_{IOUT2}$ is output at a second intermediate node $N_{I2}$ formed by an interconnection of drain terminals of the fourth input transistor 248b and the fourth bias transistor 252b.

The second control transistor 254 has a gate terminal connected to the reset output terminal and a source terminal connected to the supply voltage $V_{DD}$. The second output transistor 256 has a gate terminal connected to the second intermediate node $N_{I2}$ to receive the second intermediate output signal $V_{IOUT2}$, a source terminal connected to ground, and a drain terminal connected to a drain terminal of the second control transistor 254. A second node voltage $V_{N2}$ is output at a second output node $N_{O2}$ formed by an interconnection of the drain terminals of the second control transistor 254 and the second output transistor 256.

The third intermediate transistor 258 has a gate terminal to receive the external reset signal $V_{ERST}$, a drain terminal connected to the second output node $N_{O2}$, and a source terminal connected to the supply voltage $V_{DD}$. The second intermediate capacitor 262 is a parasitic capacitor that is connected between the second output node $N_{O2}$ and ground. The fourth intermediate transistor 260 has a gate terminal connected to the reset output terminal by way of the second inverter 264, a source terminal connected to ground, and a drain terminal connected to the second intermediate node $N_{I2}$. The second output inverter 266 receives the second node voltage $V_{N2}$ and outputs the second output signal $V_{OUT2}$.

Figure 3:
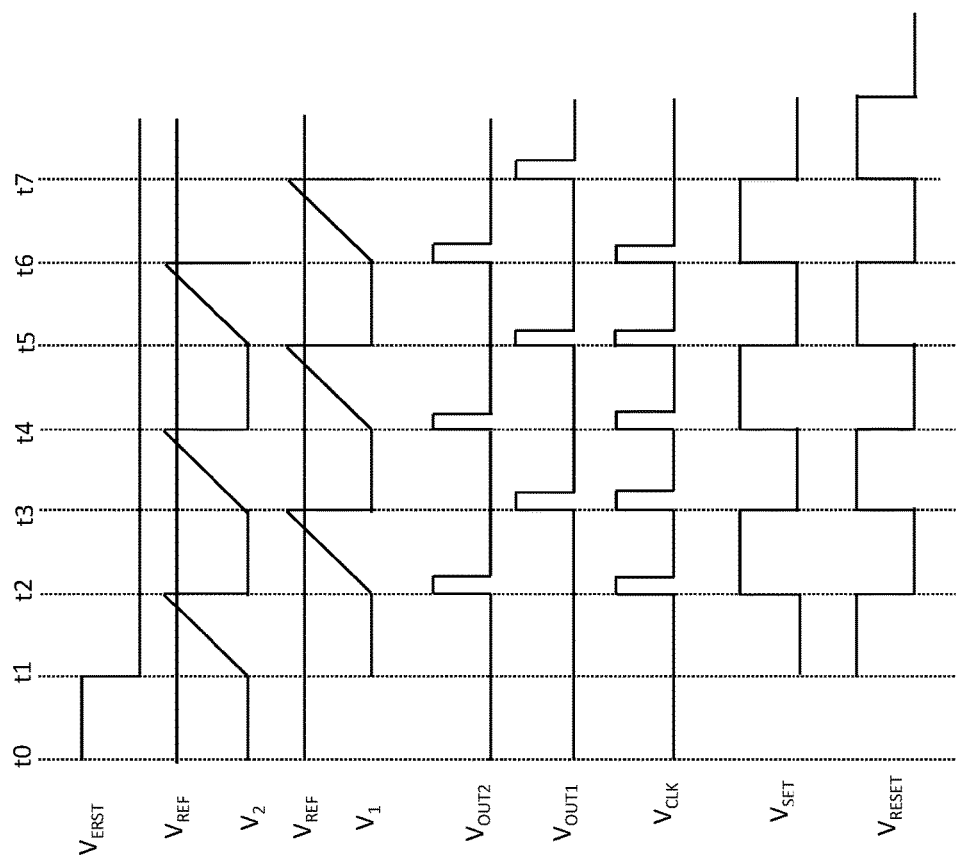
FIG. 3 is a timing diagram illustrating various signals of the relaxation oscillator of FIG. 2.

Referring now to FIG. 3, a timing diagram illustrating the external reset signal $V_{ERST}$, the first and second input voltages $V_1$ and $V_2$, the first and second output signals $V_{OUT1}$ and $V_{OUT2}$, the clock signal $V_{CLK}$, and the set and reset signals $V_{SET}$ and $V_{RESET}$ of the relaxation oscillator circuit 100 of FIG. 2 is shown.

In operation, at time t1, the external reset signal $V_{ERST}$ is deactivated. The SR latch 212 deactivates the set signal $V_{SET}$ and activates the reset signal $V_{RESET}$. The reset discharge transistor 206, the second control transistor 254, the fourth intermediate transistor 260, and the first bypass transistor 268 are switched OFF. The set discharge transistor 204, the first control transistor 234, the first through third intermediate transistors 238, 240, and 258, and the second bypass transistor 270 are switched ON. The set discharge transistor 204 discharges the set capacitor 208. The reset capacitor 210 receives the charge current $I_C$ by way of the second bypass transistor 270 and starts charging linearly. When the second input voltage $V_2$ is equal to the reference voltage $V_{REF}$, equal currents flow through the third and fourth input transistors 248a and 248b. The reset capacitor 210 charges until the second input voltage $V_2$ is greater than the reference voltage $V_{REF}$. When the second input voltage $V_2$ is greater than the reference voltage $V_{REF}$, the second intermediate output signal $V_{IOUT2}$ is activated.

At time t2, when the second input voltage $V_2$ is greater than the reference voltage $V_{REF}$, the second intermediate output signal $V_{IOUT2}$ is activated and the second output transistor 256 is switched ON. The second node voltage $V_{N2}$ drops to zero and the second comparator 216 outputs the inverted version of the second node voltage $V_{N2}$. The reset comparator 216 activates the second output signal $V_{OUT2}$. Since the first input voltage $V_1$ is less than the reference voltage $V_{REF}$, the first intermediate output signal $V_{IOUT1}$ is deactivated and the first output transistor 236 is switched OFF. The first node voltage $V_{N1}$ is charged to a voltage level of the supply voltage $V_{DD}$. The set comparator 214 outputs the inverted version of the first node voltage $V_{N1}$, and deactivates the first output signal $V_{OUT1}$.

The XOR gate 226 provides the XOR of the deactivated first output signal $V_{OUT1}$ and the activated second output signal $V_{OUT2}$ to the clock input terminal. The SR latch 212 activates the set signal $V_{SET}$ and deactivates the reset signal $V_{RESET}$. Thereafter, the reset discharge transistor 206 and the first bypass transistor 268 are switched ON, and the set discharge transistor 204 and the second bypass transistor 270 are switched OFF. The reset discharge transistor 206 discharges the reset capacitor 210. The set capacitor 208 receives the charge current $I_C$ by way of the first bypass transistor 268 and starts charging. The first input voltage $V_1$ increases linearly. When the first input voltage $V_1$ is equal to the reference voltage $V_{REF}$, equal currents flow through the first and second input transistors 228a and 228b. The set capacitor 208 charges until the first input voltage $V_1$ is greater than the reference voltage $V_{REF}$. When the first input voltage $V_1$ is greater than the reference voltage $V_{REF}$, the set comparator 214 activates the first output signal $V_{OUT1}$.

At time t3, the first input voltage $V_1$ is greater than the reference voltage $V_{REF}$ and the set comparator 214 activates the first output signal $V_{OUT1}$. The functioning of the reset comparator 216 is similar to that of the reset comparator 216. Since the second input voltage $V_2$ is zero i.e., less than the reference voltage $V_{REF}$, the second output signal $V_{OUT2}$ is deactivated. The XOR gate 226 provides the XOR of the activated first output signal $V_{OUT1}$ and the deactivated second output signals $V_{OUT2}$ to the clock input terminal. The SR latch 212 deactivates the set signal $V_{SET}$ and activates the reset signal $V_{RESET}$. Thus, the SR latch 212 alternately activates the set and reset signals $V_{SET}$ and $V_{RESET}$ at predefined time intervals when the clock signal $V_{CLK}$ is activated.

At time t1, if the temperature increases, the charge current $I_C$ decreases, and the time required to charge the reset capacitor 210 to a voltage level of the reference voltage $V_{REF}$ increases. Thus, the reset comparator 216 activates the second output signal $V_{OUT2}$ after a delay that introduces an error in the clock signal $V_{CLK}$. The time required to toggle the logic states of the set and reset signals $V_{SET}$ and $V_{RESET}$ increases, thereby introducing errors in frequencies of the set and reset signals $V_{SET}$ and $V_{RESET}$. However, the resistances of the third and fourth resistors 250a and 250b increase with increase in the temperature, thereby increasing the gain of the reset comparator 216. The time required by the reset comparator 216 to activate the second output signal $V_{OUT2}$ decreases. Thus, the delay in the clock signal $V_{CLK}$ due to the increase in the temperature is compensated for by the increase in the gain of the reset comparator 216, particularly due to the increase in the resistances of the third and fourth resistors 250a and 250b.

Similarly, at time t2, the time required to charge the set capacitor 208 to the voltage level of the reference voltage $V_{REF}$ increases. Thus, the set comparator 214 activates the first output signal $V_{OUT1}$ after a delay, which introduces an error in the frequency of the clock signal $V_{CLK}$. The resistances of the first and second resistors 230a and 230b increase with increase in the temperature, thereby increasing the gain of the set comparator 214. The time required by the set comparator 214 to activate the first output signal $V_{OUT1}$ decreases with the increase in the temperature. Thus, the delay in the clock signal $V_{CLK}$ due to the increase in the temperature is compensated for by the increase in the gain of the set comparator 214, particularly due to the increase in the resistances of the first and second resistors 230a and 230b.

At time t1, if the temperature decreases, the charge current $I_C$ increases, and the time required to charge the reset capacitor 210 to a voltage level of the reference voltage $V_{REF}$ decreases. Thus, the reset comparator 216 activates the second output signal $V_{OUT2}$ after a reduced delay, which introduces an error in the clock signal $V_{CLK}$. Further, the time required to toggle the logic states of the set and reset signals $V_{SET}$ and $V_{RESET}$ decreases which introduces errors in frequencies of the set and reset signals $V_{SET}$ and $V_{RESET}$. The resistances of the third and fourth resistors 250a and 250b decrease with decrease in the temperature, thereby decreasing the gain of the reset comparator 216. The time required by the reset comparator 216 to activate the second output signal $V_{OUT2}$ increases. Thus, the delay in the clock signal $V_{CLK}$ due to decrease in the temperature is compensated for by the decrease in the gain of the reset comparator 216, particularly due to the decrease in the resistances of the third and fourth resistors 250a and 250b.

Similarly, at time t2, the time required to charge the set capacitor 208 to the voltage level of the reference voltage $V_{REF}$ decreases. Thus, the set comparator 214 activates the first output signal $V_{OUT1}$ after a reduced delay, which introduces an error in the frequency of the clock signal $V_{CLK}$. The resistances of the first and second resistors 230a and 230b decrease with decrease in the temperature, thereby decreasing the gain of the set comparator 214. The time required by the set comparator 214 to activate the first output signal $V_{OUT1}$ increases with the decrease in the temperature. Thus, the delay in the clock signal $V_{CLK}$ due to decrease in the temperature is compensated for by the decrease in the gain of the set comparator 214, particularly due to the decrease in the resistances of the first and second resistors 230a and 230b.

Thus, the relaxation oscillator circuit 100 generates the LTC clock signal that is less sensitive to temperature variations. The relaxation oscillator circuit 100 includes only PTC resistors. Hence, fabrication of the relaxation oscillator circuit 100 is not restricted to a limited number of fabrication processes. Moreover fabrication processes such as the FD-SOI, which are not suitable for the fabrication of NTC resistors, can be used to fabricate the relaxation oscillator circuit 100.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A relaxation oscillator circuit for generating a low temperature coefficient (LTC) clock signal, comprising:
   a first transistor having a source terminal connected to a supply voltage, and a drain terminal that outputs a first LTC current;
   a first current path comprising first and second series connected resistors, wherein the first resistor has a first terminal that is connected to the drain terminal of the first transistor to receive a first proportional-to-absolute-temperature (PTAT) current, wherein a bandgap voltage is output at a first node formed by a connection of the first terminal of the first resistor and the drain terminal of the first transistor, and wherein a first voltage is output at a second node formed by a connection of a second terminal of the first resistor and a first terminal of the second resistor;
   a second current path comprising a third resistor, wherein the third resistor has a first terminal connected to the drain terminal of the first transistor to receive a second PTAT current;
   a second transistor having an emitter terminal connected to a second terminal of the second resistor, and base and collector terminals connected to ground;
   a third transistor having base and collector terminals connected to the base terminal of the second transistor and an emitter terminal connected to a second terminal of the third resistor, wherein a second voltage is output at a third node formed by a connection of the second terminal of the third resistor and the emitter terminal of the third transistor;
   a first amplifier having a first terminal connected to the second node to receive the first voltage, a second terminal connected to the third node to receive the second voltage, and an output terminal that outputs a first output signal based on a comparison of the first voltage with the second voltage, wherein the first output signal is active when the first voltage is greater than the second voltage and inactive when the first voltage is less than the second voltage;
   a first resistor ladder connected between the first node and ground, wherein the first resistor ladder comprises a set of series connected positive temperature coefficient (PTC) resistors, wherein the first resistor ladder receives a complementary-to-absolute-temperature (CTAT) current, and wherein the first LTC current is a sum of the first PTAT current, the second PTAT current, and the CTAT current;
   a second amplifier having a first terminal connected to an output terminal thereof, a second terminal connected to the first node to receive the bandgap voltage, wherein the second amplifier buffers the bandgap voltage, and generates a second output signal that is an LTC voltage;
   a fourth transistor having a source terminal connected to the supply voltage, a gate terminal connected to a gate terminal of the first transistor, and a drain terminal that mirrors the first LTC current and generates a second LTC current; and
   an oscillator connected to the second amplifier to receive the second output signal as a reference voltage, and connected to the drain terminal of the fourth transistor to receive the second LTC current, wherein the oscillator generates the LTC clock signal.

2. The relaxation oscillator circuit of claim 1, wherein a resistance of the first resistor is a multiple "x" of a resistance of the second resistor, wherein "x" is a positive integer.

3. The relaxation oscillator circuit of claim 1, further comprising:
   a second resistor ladder connected between the output terminal of the second amplifier and ground, wherein the second resistor ladder comprises a set of series connected resistors, and wherein the second resistor ladder provides a plurality of intermediate reference voltages; and
   a multiplexer that receives a select signal, and is connected to the second amplifier and the second resistor ladder to receive the second output signal and the plurality of intermediate reference voltages, respectively, and provides one of the second output signal and an intermediate reference voltage of the plurality of intermediate reference voltages as the reference voltage.

4. The relaxation oscillator circuit of claim 1, wherein the oscillator comprises:
   first and second capacitors that receive the second LTC current by way of a switch, wherein the first and second capacitors are charged to first and second charge voltages, respectively, wherein the switch receives a control signal that controls a position of the switch and provides the second LTC current to the first and second capacitors;
   a first comparator having a first terminal that receives the reference voltage and a second terminal connected to the first capacitor to receive the first charge voltage, and an output terminal that outputs a first trigger signal based on a comparison of the first charge voltage with the reference voltage, wherein the first trigger signal is active when the reference voltage is less than the first charge voltage and is inactive when the reference voltage is greater than the first charge voltage;
   a second comparator having a first terminal that receives the reference voltage and a second terminal connected to the second capacitor to receive the second charge voltage, and an output terminal that outputs a second trigger signal based on a comparison of the second charge voltage with the reference voltage, wherein the second trigger signal is active when the reference voltage is greater than the second charge voltage and inactive when the reference voltage is less than the second charge voltage; and a logic circuit that receives the first and second trigger signals and generates the LTC clock signal.

5. A relaxation oscillator circuit for generating a low temperature coefficient (LTC) clock signal, comprising:

a set discharge transistor coupled across a set capacitor;

a reset discharge transistor coupled across a reset capacitor;

a set-reset (SR) latch with a set output terminal coupled to a gate terminal of the set discharge transistor to output a set signal, a reset output terminal coupled to a gate terminal of the reset discharge transistor to output a reset signal, a set input terminal coupled to the reset output terminal thereof, a reset input terminal that receives an external reset signal, and a clock input terminal that receives a clock signal, wherein the set capacitor receives a charge current and is charged to a first input voltage when the set signal is activated, and the reset capacitor receives the charge current and is charged to a second input voltage when the reset signal is activated, and wherein the SR latch activates at least one of the set and reset signals when the clock signal is activated;

a set comparator having a first input coupled to a first terminal of the set capacitor, a second input that receives a reference voltage, and an output coupled to the clock input terminal by way of an XOR gate, wherein the set comparator outputs a first output signal, and wherein the set comparator comprises:

first and second input transistors forming a pair of parallel coupled transistors that have a common node coupled to receive a first reference current, wherein the first input transistor has a gate terminal that provides the first input of the set comparator to receive the first input voltage and the second input transistor has a gate terminal that provides the second input of the set comparator to receive the second input voltage;

first and second series connected resistors connected between drain terminals of the first and second input transistors, wherein the first and second resistors are positive temperature coefficient (PTC) resistors;

first and second bias transistors each having a gate terminal connected to a node between the first and second resistors, a source terminal connected to ground, and a drain terminal, wherein the drain terminals of the first and second bias transistors are connected to the drain terminals of the first and second input transistors, respectively, and wherein a first intermediate output signal is output at a first intermediate node formed by an interconnection of the drain terminals of the second input transistor and the second bias transistor;

a first control transistor having a gate terminal connected to the set output terminal and a source terminal connected to a supply voltage; and a first output transistor having a gate terminal connected to the first intermediate node to receive the first intermediate output signal, a source terminal connected to ground, and a drain terminal connected to a drain terminal of the first control transistor, wherein a first node voltage is output at a first output node formed by an interconnection of the drain terminal of the first control transistor and the first output transistor, wherein the set comparator outputs an inverted version of the first node voltage as the first output signal by way of a first output inverter, and wherein an output terminal of the first output inverter provides the output of the set comparator; and a reset comparator having a first input coupled to a first terminal of the reset capacitor, a second input that receives the reference voltage, and an output coupled to the clock terminal input by way of the XOR gate, wherein the reset comparator outputs a second output signal, and wherein the SR latch activates the clock signal based on the first and second output signals, and the LTC clock signal is at least one of the set and reset signals.

6. The relaxation oscillator circuit of claim 5, wherein the set comparator further comprises:

a first intermediate transistor having a gate terminal that receives the external reset signal, a drain terminal connected to the first output node, and a source terminal connected to the supply voltage; and a second intermediate transistor having a gate terminal connected to the set output terminal by way of a first inverter, a source terminal connected to ground, and a drain terminal connected to the first intermediate node.

7. The relaxation oscillator circuit of claim 5, wherein the reset comparator includes:

third and fourth input transistors forming a pair of parallel coupled transistors with a common node coupled to receive a second reference current, wherein the third input transistor has a gate terminal connected to the first input of the reset comparator and the fourth input transistor has a gate terminal connected to the second input of the reset comparator;

third and fourth series connected resistors connected between drain terminals of the third and fourth input transistors, wherein the third and fourth resistors are positive temperature coefficient (PTC) resistors;

third and fourth bias transistors each having a gate terminal connected to a node between the third and fourth series connected resistors, a source terminal connected to ground, and a drain terminal, wherein the drain terminals of the third and fourth bias transistors are connected to the drain terminals of the third and fourth input transistors, respectively, and wherein a second intermediate output signal is provided at a second intermediate node formed at a connection of the drain terminals of the fourth input transistor and the fourth bias transistor;

a second control transistor having a gate terminal connected to the reset output terminal of the SR latch and a source terminal connected to the supply voltage; and a second output transistor having a gate terminal connected to the second intermediate node to receive the second intermediate output signal, a source terminal connected to ground, and a drain terminal connected to a drain terminal of the second control transistor, wherein a second node voltage is output at a second output node formed at a connection of the drain terminal of the second control transistor and the second output transistor, wherein the reset comparator outputs an inverted version of the second node voltage as the second output signal by way of a second output inverter, and wherein the output of the reset comparator is provided at an output terminal of the second output inverter.

8. The relaxation oscillator circuit of claim 7, wherein the reset comparator further comprises:

a first intermediate transistor having a gate that receives the external reset signal, a drain connected to the second output node, and a source connected to the supply voltage; and a second intermediate transistor having a gate connected to the reset output terminal by way of a second inverter, a source connected to ground, and a drain connected to the second intermediate node.

9. The relaxation oscillator circuit of claim 5, further comprising:

a current generator that generates the charge current, wherein the charge current is a complementary-to-absolute-temperature (CTAT) current.

10. The relaxation oscillator circuit of claim 9, wherein the current generator includes an amplifier, first and second current generator transistors, and an intermediate resistor, the relaxation oscillator circuit further comprising:

a first bypass transistor having a gate terminal connected to the set output terminal to receive the set signal, a source terminal connected to the first terminal of the set capacitor, and a drain terminal connected to the current generator to receive the charge current, wherein the first bypass transistor provides the charge current to the set capacitor when the set signal is activated;

a second bypass transistor having a gate terminal connected to the reset output terminal to receive the reset signal, a source terminal connected to the first terminal of the reset capacitor, and a drain terminal connected to the current generator to receive the charge current, wherein the second bypass transistor provides the charge current to the reset capacitor when the reset signal is activated; and a reset transistor having a gate that receives the external reset signal, a drain connected to the current generator to receive the charge current, and a source connected to ground.

11. The relaxation oscillator circuit of claim 5, wherein gains of the set and reset comparators increase with an increase in temperature.

12. The relaxation oscillator circuit of claim 1, wherein a resistance of the first resistor is equal to a resistance of the third resistor.

13. The relaxation oscillator circuit of claim 1, wherein an area of the second transistor is a multiple "y" of an area of the third transistor, and wherein "y" is a positive integer.

* * * * *